United States Patent
Stockum et al.

(10) Patent No.: US 9,355,867 B2
(45) Date of Patent: May 31, 2016

(54) PROCESS FOR THE PRODUCTION OF SOLAR CELLS HAVING A LOCAL BACK SURFACE FIELD (LBSF)

(71) Applicant: Merck Patent GmbH, Darmstadt (DE)

(72) Inventors: Werner Stockum, Reinheim (DE); Oliver Doll, Dietzenbach (DE); Ingo Koehler, Reinheim (DE); Christian Matuschek, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 14/408,627

(22) PCT Filed: May 24, 2013

(86) PCT No.: PCT/EP2013/001544
§ 371 (c)(1),
(2) Date: Dec. 17, 2014

(87) PCT Pub. No.: WO2014/000845
PCT Pub. Date: Jan. 3, 2014

(65) Prior Publication Data
US 2015/0187965 A1    Jul. 2, 2015

(30) Foreign Application Priority Data

Jun. 25, 2012    (EP) .................................... 12004763

(51) Int. Cl.
*H01L 21/461* (2006.01)
*H01L 23/58* (2006.01)
*H01L 21/302* (2006.01)
(Continued)

(52) U.S. Cl.
CPC ............ *H01L 21/461* (2013.01); *H01L 21/302* (2013.01); *H01L 31/02021* (2013.01); *H01L 31/02167* (2013.01); *H01L 31/022425* (2013.01); *H01L 31/022441* (2013.01);
(Continued)

(58) Field of Classification Search
CPC ........................ H01L 31/02021; H01L 21/461
USPC .................. 438/692, 704, 743, 749; 257/650, 257/641–644
See application file for complete search history.

(56) References Cited

U.S. PATENT DOCUMENTS 7,402,448 B2    7/2008 Narayanan et al.
8,088,297 B2 *  1/2012 Kuebelbeck et al. ........... 216/79
(Continued)

FOREIGN PATENT DOCUMENTS

CN    1679147 A    10/2005
CN    101098833 A    1/2008
(Continued)

OTHER PUBLICATIONS

International Search Report from PCT/EP2013/001544 dated Sep. 5, 2013.
(Continued)

*Primary Examiner* — Calvin Lee
(74) *Attorney, Agent, or Firm* — Millen White Zelano and Branigan, PC; Csaba Henter; Anthony Zelano (57) ABSTRACT

The present invention relates to a method for producing solar cells with local back surface field (LBSF) using an alkaline etching paste which allows the back surface to be polished and the back surface edges to be insulated in a single process step.

12 Claims, 10 Drawing Sheets

1. Texturing

2. 65Ω/sq diffusion (POCl₃)

3. Back surface polishing and edge insulation (in one process step using etching paste) and PSG etching 4. Deposition of the passivation layer (SiO₂ or Al₂O₃) and PECVD SiNₓ

5. Opening of the passivation layer (SiO₂/SiNₓ or Al₂O₃/SiNₓ) using SolarEtch® AQS 6. Screen printing of the front and back surfaces Co-firing A: Untreated surface    B: Surface treated with etching paste (51) Int. Cl.
  *H01L 31/0224* (2006.01)
  *H01L 31/02* (2006.01)
  *H01L 31/18* (2006.01)
  *H01L 31/0216* (2014.01)
  *H01L 31/068* (2012.01)

(52) U.S. Cl.
  CPC .......... *H01L31/068* (2013.01); *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 8,540,891 | B2 | 9/2013 | Kubelbeck et al. |
| 2004/0259335 | A1 | 12/2004 | Narayanan et al. |
| 2005/0247674 | A1 | 11/2005 | Kubelbeck et al. |
| 2008/0271780 | A1 | 11/2008 | Narayanan et al. |
| 2009/0223549 | A1* | 9/2009 | Ounadjela et al. ............ 136/244 |
| 2010/0193016 | A1 | 8/2010 | Fernandez et al. |
| 2012/0094421 | A1 | 4/2012 | Kim et al. |
| 2013/0228220 | A1* | 9/2013 | Schum et al. ................ 136/256 |

FOREIGN PATENT DOCUMENTS

| | | |
|---|---|---|
| CN | 101853899 A | 10/2010 |
| KR | 20100096819 A | 9/2010 |

OTHER PUBLICATIONS

J. Rentsch et al. "Single Side Etching—Key Technology for Industrial High Efficiency Processing" 23rd European Photovoltaic Solar Energy Conference, Sep. 1-5, 2008, pp. 1889-1892.

O. Doll et al. "Improved Edge Isolation of Solar Cells Applying Readily Dispensable Etching Paste" 24th European Photovoltaic Solar Energy Conference, Sep. 21-25, 2009, pp. 1762-1766.

English Abstract of KR 20100096819—Publication Date: Sep. 2, 2010.

English Abstract of CN 101098833—Publication Date: Jan. 2, 2008.

Machine Translation of CN 101853899—Publication Date: Oct. 6, 2010.

Chinese Office Action relating to PCT/EP2013/001544 of Jun. 25, 2012—Date of Notification: Feb. 19, 2016.

* cited by examiner

1. Texturing

2. Back surface polishing using HF/HNO$_3$ 3. 65 Ω/sq diffusion (POCl$_3$)

4. Edge insulation using HF/HNO$_3$ (back surface) and PSG etching

5. Deposition of the passivation layer (SiO$_2$ or Al$_2$O$_3$) and PECVD SiN$_x$ 6. Opening of the passivation layer (SiO$_2$/SiN$_x$ or Al$_2$O$_3$/SiN$_x$) using laser 7. Screen printing of the front and back surfaces Co-firing

Fig. 3
Prior Art

1. Texturing

2. Back surface polishing using $HF/HNO_3$ 3. 65Ω/sq diffusion ($POCl_3$)

4. Edge insulation using $HF/HNO_3$ (back surface) and PSG etching

5. Deposition of the passivation layer ($SiO_2$ or $Al_2O_3$) and PECVD $SiN_x$

6. Opening of the passivation layer ($SiO_2/SiN_x$ or $Al_2O_3/SiN_x$) using SolarEtch® AQS 7. Screen printing of the front and back surfaces Co-firing

A: Untreated surface    B: Surface treated with etching paste

PROCESS FOR THE PRODUCTION OF SOLAR CELLS HAVING A LOCAL BACK SURFACE FIELD (LBSF)

The present invention relates to a process for the production of solar cells having a local back surface field using printable etching pastes.

PRIOR ART

For the production of silicon solar cells, it is known to coat the latter with a passivating antireflection layer on the front surface and to provide them with metallisation over the entire back surface (back surface field). For this metallisation, use is usually made of an aluminium-based screen-printing paste, which is baked at sintering temperatures >800° C. The low-melting Al/Si eutectic formed in this sintering process forms an alloy with the silicon surface and has a p-doping action.

In addition, contact points are usually printed on the back surface using silver paste. These are necessary for the soldering of the cells to the module. The back surface busbars printed using silver paste can be applied in strips (below the front surface busbar) and can have twice the width of the front surface busbar.

The back surface design of a standard solar cell is employed in many variants in production.

A description of this technology is given in the publications:

P. Choulat et al; 22nd European Photovoltaic Solar Energy Conference (2007), Milan, Italy and G. Agostinelli et al, 20th European Photovoltaic Conference (2005), Barcelona, Spain In addition, the literature indicates the optimisation of the back surface field through the use of an oxidic passivation layer as replacement for a full-area aluminium layer.

The back surface contact here is produced via small dot or line contacts using the p-doped aluminium. This special back surface contact structure is known as a local back surface field (LBSF).

The method for the production of a local back surface field (LBSF) structure that has been described and used the most frequently to date is carried out by laser. The thin aluminium layer here is melted with the silicon by means of laser through the oxide layer ($SiO_2$ or $Al_2O_3$). An essential disadvantage of this method is, however, the damage to the silicon surface, resulting in an increased electron recombination rate at the surface.

Novel cell concepts in connection with a local back surface field (LBSF) are described for highly efficient solar cells having an efficiency of greater than 20% (M. A. Green, J. Zhao, A. Wang, S. R. Wenham, Solar Energy Materials & Solar Cells 65 (2001) 9-16, Progress and outlook for high efficiency crystalline solar cells).

The use of LBSF technology enables a significant increase in the efficiency of solar cells (better known from PERC—passivated emitter rear contact) of greater than 0.5% (absolute) to be achieved. In accordance with the known prior art, a double layer—consisting of aluminium oxide or $SiO_2$ and silicon nitride—is applied to the back surface of the wafer (by means of PECVD) for back surface passivation.

Figure 1:
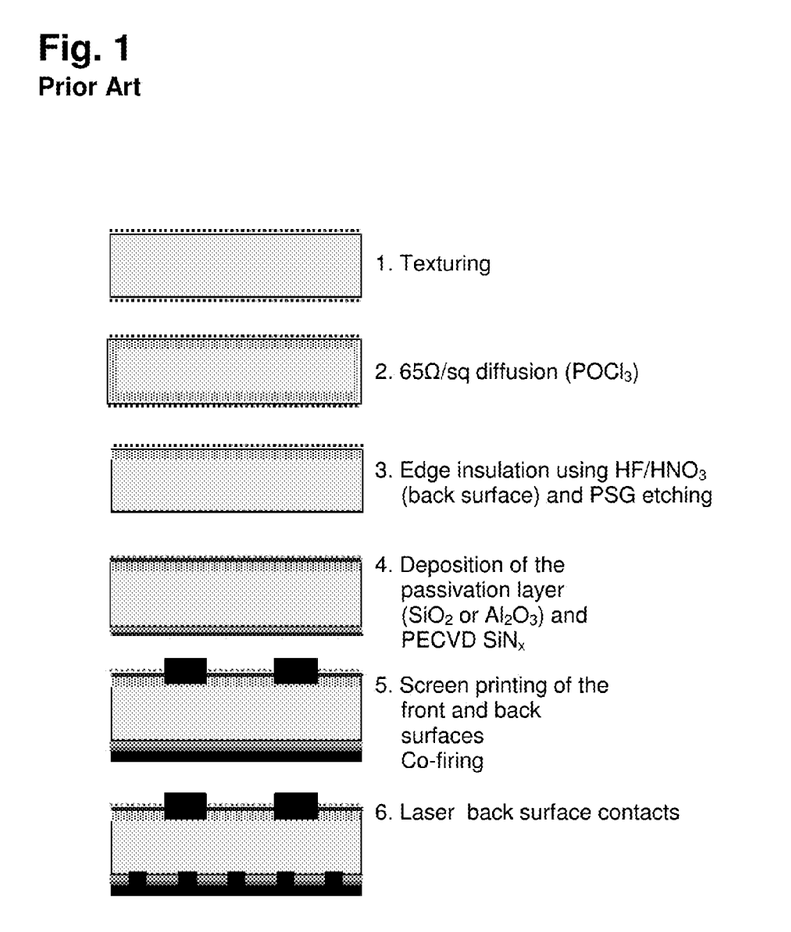
FIG. 1: Process variant A of a standard process for the production of solar cells having an LBSF
Figure 2:
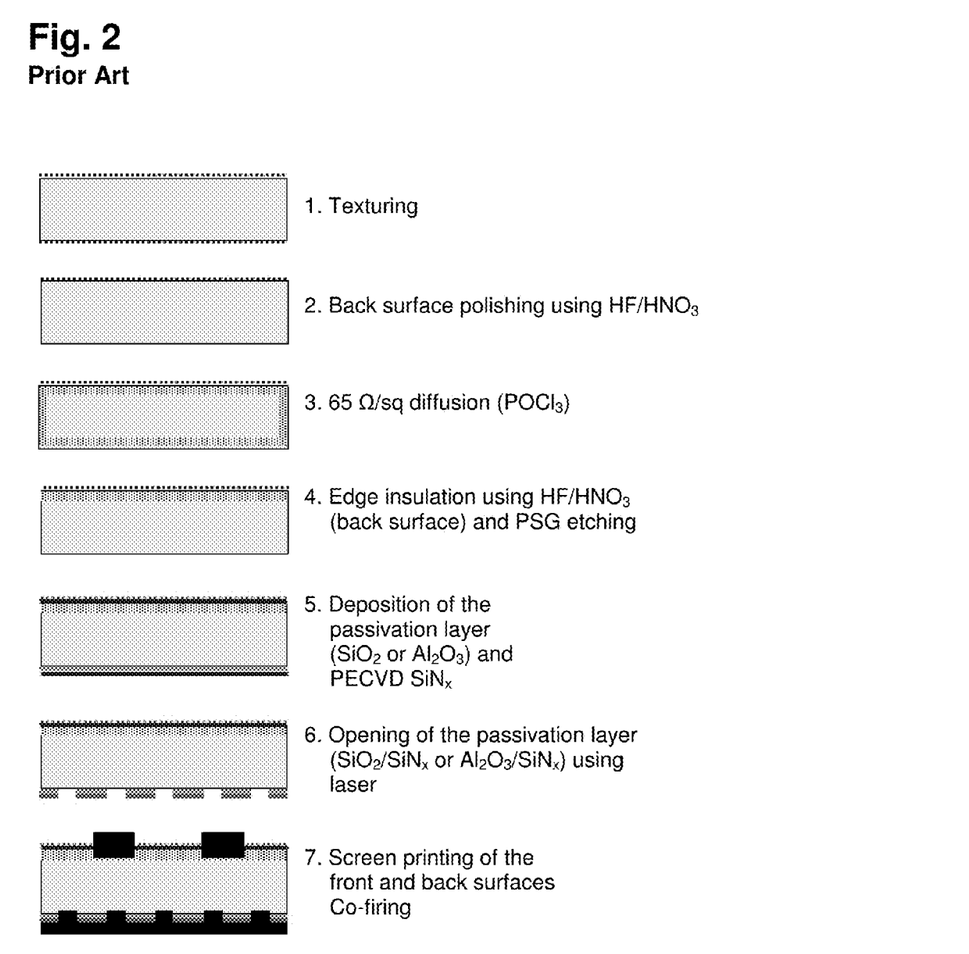
FIG. 2: Process variant B of a standard process for the production of solar cells having an LBSF
Figure 3:
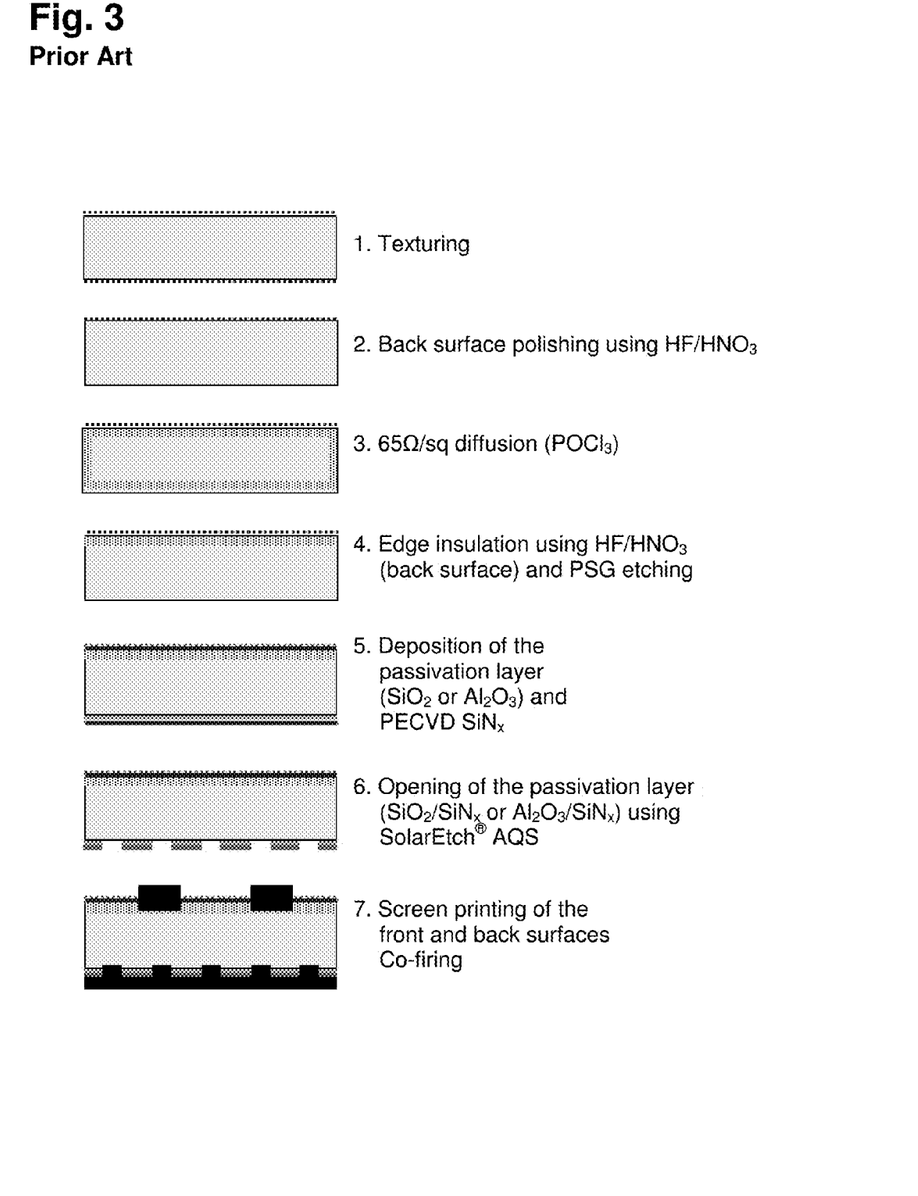
FIG. 3: Process variant C of a newer process for the production of solar cells having an LBSF

FIGS. 1, 2 and 3 depict process flow charts of the requisite process steps which have hitherto had to be carried out in the production of solar cells having a local back surface field (LBSF). These production methods have already been introduced in the industrial production of solar cells.

According to process variant A, as depicted in FIG. 1, the production of solar cells having an LBSF comprises the following steps:
1. Texturing of the surface with a pyramidal structure
2. Phosphorus doping (65 Ω/sq diffusion of $POCl_3$)
3. Edge insulation using $HF/HNO_3$ on the back surface and PSG etching
4. Deposition of a passivation layer ($SiO_2$ or $Al_2O_3$) and an $SiN_x$ layer (PECVD $SiN_x$)
5. Screen printing for metallisation of the surface (silver paste) and the back surface (aluminium paste)/sintering
6. Laser contacting of the back surface aluminium with silicon According to process variant B, as depicted in FIG. 2, the production of solar cells having an LBSF comprises the following steps:
1. Texturing of the surface with a pyramidal structure
2. Back surface polishing (etch-polishing using $HF/HNO_3$)
3. Phosphorus doping (65 Ω/sq diffusion of $POCl_3$)
4. Edge insulation using $HF/HNO_3$ on the back surface and PSG etching
5. Deposition of passivation layer ($SiO_2$ or $Al_2O_3$) and $SiN_x$ layer (PECVD $SiN_x$)
6. Selective opening of the passivation layer and $SiN_x$ layer by means of laser
7. Screen printing for metallisation of the front surface (silver paste) and back surface (aluminium paste)/sintering Since 2011, a process variant C has been known, as depicted in FIG. 3 (presented at the PVSEC Conference 2011), which enables the production of solar cells having an LBSF which have higher efficiencies than variant B.

This process variant C comprises the following seven steps, which are also depicted in FIG. 3:
1. Texturing of the surface with a pyramidal structure
2. Back surface polishing (etch-polishing using $HF/HNO_3$)
3. Phosphorus doping (65 Ω/sq diffusion of $POCl_3$)
4. Edge insulation using $HF/HNO_3$ on the back surface and PSG etching
5. Deposition of a passivation layer ($SiO_2$ or $Al_2O_3$) and an $SiN_x$ layer (PE-CVD $SiN_x$)
6. Selective opening of the passivation layer and the $SiN_x$ layer by means of etching paste (SolarEtch AQS printing, heating, rinsing)
7. Screen printing for metallisation of the surface (silver paste) and back surface (aluminium paste)/sintering In this process variant, the wafer is chemically polished on the back surface using an $HF/HNO_3$ mixture (removal of the texture) after the alkaline texturing (in the case of Cz-Si wafers) or the acidic texturing (in the case of mc-Si wafers). The wafer is then treated with $POCl_3$ at temperatures of about 800-850° C. for about 25 min. During this treatment, phosphorus diffuses into the surface of the wafer. At the same time, the surface resistance is thereby adjusted to about 65 ohm/sq (Ω/sq). The edge insulation (opening of the p/n junction) is carried out by an $HF/HNO_3$ mixture on the back surface of the wafer (equipment from RENA). For this etching step, the etch-bath concentration and the residence time are adjusted in order to achieve the desired etching depth or the desired shunt value of the finished cell. A shunt value of 30-40 k$\Omega cm^2$ is usually set using back surface etching.

The PSG glass on the front surface (phosphosilicate glass) is removed with the aid of hydrofluoric acid. The wafer is subsequently rinsed and dried and sent to the next production step, in which the passivation layer is deposited. The latter can be carried out by thermal deposition of $SiO_2$ or, for $Al_2O_3$, by the ALD method (atomic layer deposition). An $SiN_x$ layer is then deposited both on the back surface and also on the front surface. This corresponds to masking with an antireflection layer (ARC deposition) and is carried out by means of plasma enhanced chemical vapour deposition (PECVD) of silicon nitride ($SiN_x$). The SolarEtch AQS etching paste is printed onto the back surface by means of screen printing (dot pattern with a diameter of about 70-100 um) and activated in a belt furnace at 390° C. The etching paste is then rinsed off using a 0.1% KOH solution in an ultrasound bath, rinsed with DI water and dried. After a silver paste has been printed on for front surface contacting and an aluminium paste has been printed on as local back surface field, the wafer is dried by heating in a belt furnace (fired).

Disadvantages of this process for the production of solar cells having a local back surface field (LBSF) are both the large number of process steps, which are time-consuming and expensive, and also the high consumption of $HF/HNO_3$.

OBJECTIVE

The object of the present invention is therefore to provide a process for the production of solar cells having a local back surface field and high effectiveness which can be carried out simply and enables time and costs as well as process steps to be saved. The object of the present invention is also to make the processes more environmentally friendly, and, for example, to restrict or if possible avoid the use of HF and $HNO_3$.

SUBJECT-MATTER OF THE INVENTION

Experiments with various etching-paste compositions have surprisingly shown that this object can be achieved by the use of novel KOH-containing etching-paste compositions and by a simultaneous modification of the process.

The present invention thus relates to a process for the production of solar cells having a local back surface field (LBSF), which is characterised in that the back surface polishing and the back surface edge insulation are facilitated one process step with the aid of an alkaline etching paste. In a further process step, the contact windows are etched into the back surface multilayer (passivation layer and $SiN_x$) with the aid of an acidic etching paste, where the acidic etching paste used has particular selectivity for silicon layers.

In particular, this novel process according to the invention differs from processes known to date through the fact that the etch-polishing and edge insulation are carried out without the use of $HF/HNO_3$ mixtures. The use of an alkaline etching paste advantageously enables chemical exhaust-air cleaning to be omitted entirely.

Figure 4:
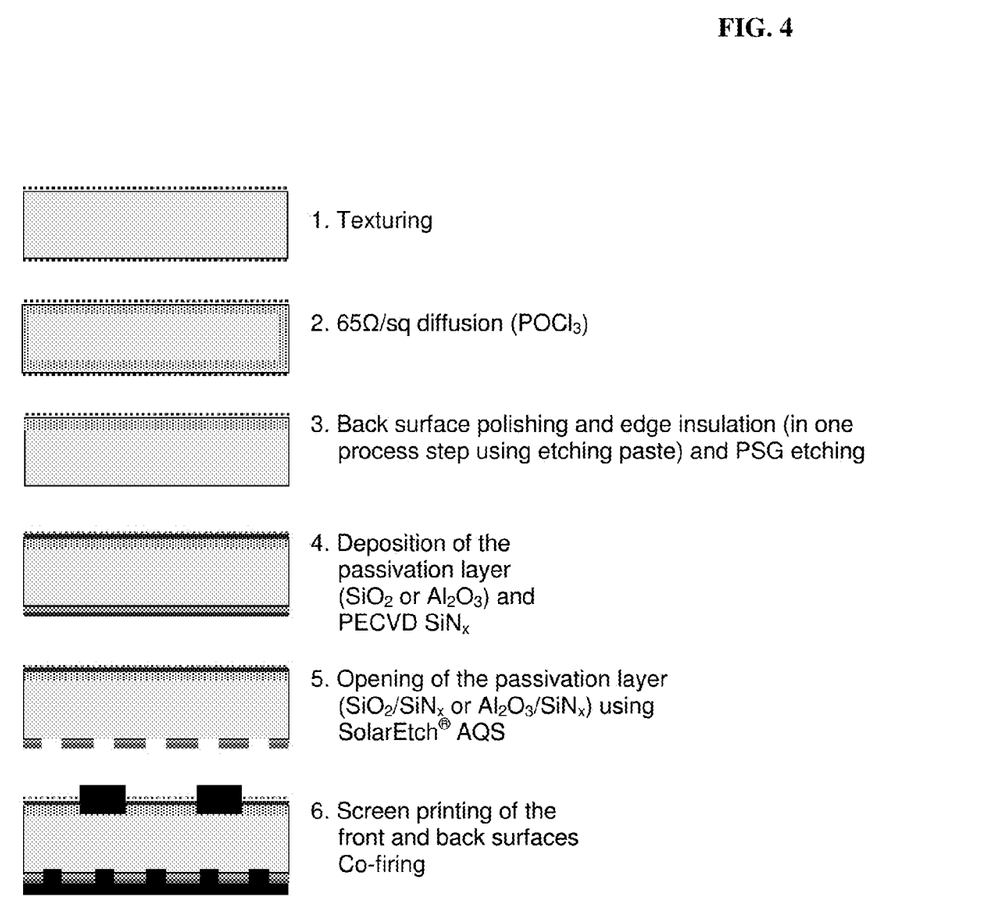
FIG. 4: Representation of process D according to the invention, comprising 6 process steps (opening of the passivation layer using etching paste)

In a preferred embodiment, as depicted in FIG. 4, the process according to the invention for the production of solar cells having a local back surface field comprises the following process steps:
I. Texturing of the surface
II. Phosphorus doping (~65 Ω/sq diffusion of $POCl_3$)
III. Etching of the back surface by means of an alkaline etching paste, by means of which the surface is polished and at the same time the p/n junction is opened, where the etching paste is printed onto the back surface using stencil printing, activated in a belt furnace at about 150° C. for 2 minutes, and the wafer is rinsed with DI water,
IV. Coating of the back surface with $SiO_2$ or $Al_2O_3$ passivation layer (15-30 nm) and subsequent coating of the back surface and front surface with silicon nitride (70-100 nm) by means of plasma enhanced chemical vapour deposition (PECVD-$SiN_x$)
V. Printing-on of the etching paste by means of screen printing, heating in the belt furnace and rinsing with DI water.
VI. Screen printing for metallisation of the front surface and the back surface with subsequent sintering (co-firing).

Figure 5:
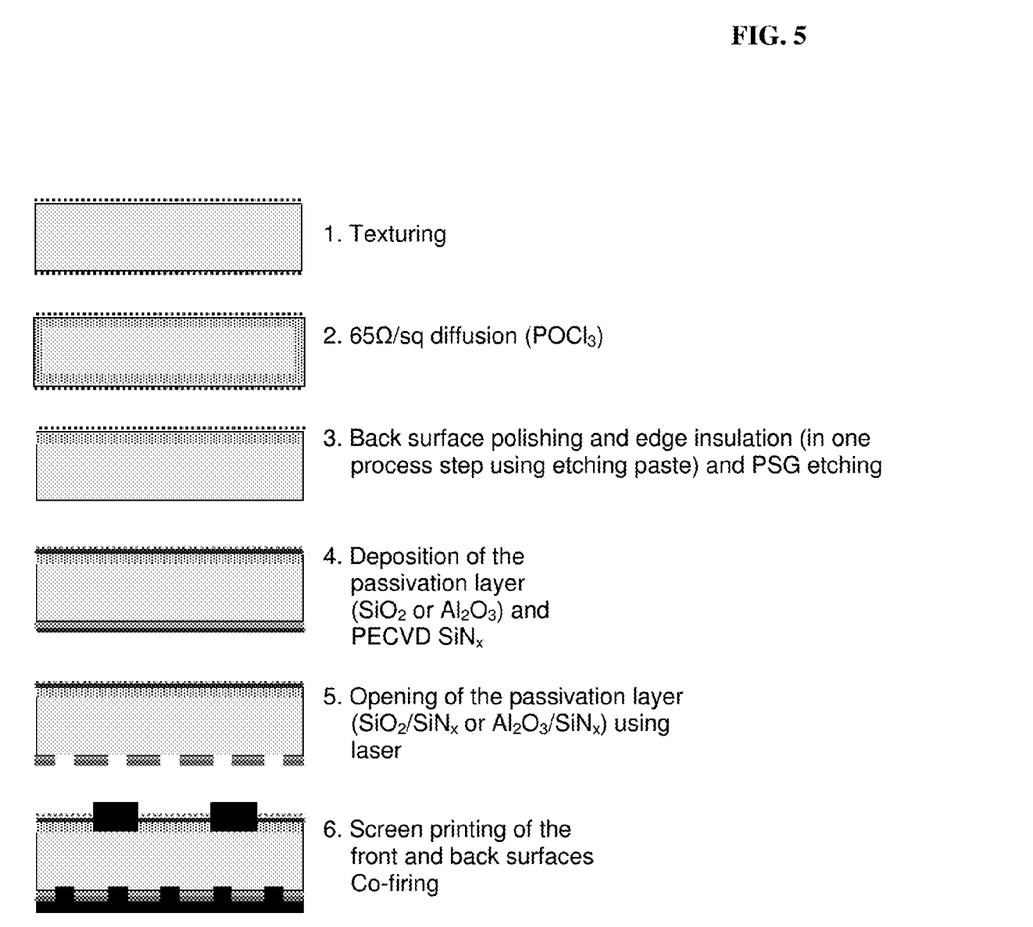
FIG. 5: Representation of process E according to the invention, comprising 6 process steps (opening of the passivation layer using laser)

In modified form after changing the sequence (FIG. 5), the process according to the invention for the production of solar cells comprising a single-step emitter comprises the process steps:
I. Texturing of the surface
II. Phosphorus doping (~65 Ω/sq diffusion of $POCl_3$)
III. Etching of the back surface by means of an alkaline etching paste, by means of which the surface is polished and at the same time the p/n junction is opened (printing of the etching paste onto the back surface using stencil printing, activation in a belt furnace at about 150° C. for 2 min, rinsing of the wafer with DI water)
IV. Coating of the back surface with $SiO_2$ or $Al_2O_3$ passivation layer (15-30 nm) and subsequent coating of the back surface and front surface with silicon nitride (70-100 nm) by means of plasma enhanced chemical vapour deposition (PECVD-$SiN_x$)
V. Opening of the $SiO_2/SiN_x$ layer or $Al_2O_3/SiN_x$ layer by means of laser (dot openings with a diameter of about 70 um)
VI. Screen printing for metallisation of the front surface and the back surface with subsequent sintering (co-firing).

A contribution is made to achieving the object according to the invention by, in particular, the use of an alkaline etching paste, which preferably comprises NaOH, KOH or mixtures thereof as alkaline etching component and which is described in the process described for the production of solar cells having a local back surface field. Particular preference is given in this connection to etching pastes which comprise KOH as etching component.

Particularly suitable for this purpose are KOH-containing etching pastes which comprise KOH in an amount of 5 to 40% by weight.

Besides the KOH, pastes according to the invention comprise a solvent or solvent mixture. Solvents which are particularly suitable for this purpose are in this case solvents selected from the group glycerol, ethylene glycol, polyethylene glycol, octanol, 1,3-propanediol, 1,4-butanediol, diethylene glycol monomethyl ether, diethylene glycol monoethyl ether, dimethyl sulfoxide and gamma-butyrolactone, each of which can be employed in pure form or in a mixture. The solvent or solvent mixture may be present in the paste in an amount of 20 to 70% by weight.

These compositions furthermore preferably comprise at least one non-particulate thickener. In particular, these pastes comprise non-particulate thickeners selected from the group polyvinylpyrrolidone, polyacrylates, carboxymethylcellulose and hydroxypropylcellulose in pure form or in a mixture. Corresponding pastes which comprise a particulate thickener selected from the group carbon black, pyrogenic silicic acid, magnesium aluminium silicates and low-melting wax particles, in pure form or in a mixture, have particularly good properties.

Very particularly suitable for use in the process according to the invention are pastes which comprise both non-particulate and also particulate thickeners. The pastes preferably comprise thickeners in an amount of 0.1-35% by weight, preferably in an amount of 0.5-35% by weight.

The use of a KOH-containing etching paste for the production of solar cells having an LBSF (local back surface field) gives solar cells having improved effectiveness. It has proven advantageous here to use etching pastes containing phosphoric acid for opening the back surface passivation layer for the production of such solar cells having an LBSF by the simplified process.

DETAILED DESCRIPTION OF THE INVENTION

Experiments have surprisingly shown that very good etching results are achieved for phosphosilicate glass (PSG or phosphorus glass) through the use of a novel KOH-containing etching paste. It has been found to be particularly advantageous here that the underlying silicon layer can be etched simultaneously in one step. Experiments with the novel etching-paste formulations have also shown that the use of the composition according to the invention both enables very good polishing results to be achieved and also the etching depth which can be achieved in a short time in the structured etching is sufficient for the opening of p/n junctions, with an etching depth of >5 μm being achieved here.

It has furthermore been found that the integration of the novel etching-paste compositions into the production process of solar cells having a local back surface field (LBSF) enables the process to be successfully simplified and to be made less expensive. The simultaneous etch-polishing and edge insulation (p/n opening) of the underlying silicon layer enables the production of solar cells having an LBSF having higher efficiency by the improved process in accordance with the present invention.

After the acidic texturing using HF and $HNO_3$ or after alkaline texturing using KOH and isopropanol in the process according to the invention, the wafer is strongly doped over the entire wafer surface. For this purpose, the wafer is doped with phosphorus using $POCl_3$ at temperatures of about 800-850° C. during a residence time of about 30 to 90 minutes. Due to the doping, the conductivity of the cell front surface is adjusted to about 60-70 ohm/sq. The novel etching paste is subsequently printed onto the back surface of the Si wafer, preferably over the entire surface, by screen printing using a special screen layout or by means of a steel stencil and heated. The wafer surface is for this purpose heated to a temperature of 100° C. to 150° C. The heating duration is 2 to 5 minutes. The heating is preferably carried out in a belt furnace. During the heating step, both the PSG layer and also the silicon layer are etched. The etching is complete when an etching depth of >5 μm has been reached. This is evident from the back surface beginning to shine strongly. After simple cleaning with DI water, the PSG glass (phosphorus glass) on the front surface of the wafer is removed in the next process step with the aid of hydrofluoric acid. The wafer is rinsed again with DI water and dried. A passivation layer is then applied to the back surface. For this purpose, $SiO_2$ can be applied with a layer thickness of 30 nm (by thermal surface oxidation) or $Al_2O_3$ can be applied with a layer thickness of 20 nm (using atomic layer deposition). Silicon nitride is subsequently deposited on the back surface and on the front surface with a layer thickness of 90 nm by PE-CVD. The SolarEtch AQS etching paste is printed onto the back surface as dot pattern (about 25,000 dots with a diameter of 90 μm) (by screen printing). The wafer surface is subsequently heated to a temperature of 350° C. to 450° C. The heating duration here is between one and 5 minutes. The heating is preferably carried out in a belt furnace. During the heating step, both the $SiN_x$ layer and also the $SiO_2$ or $Al_2O_3$ layer are etched. After this process step, the wafer surface is cleaned with 0.1-0.4% KOH solution in an ultrasound bath, rinsed with DI water and dried. The corresponding silver paste is printed onto the front surface for front surface contacting, while an aluminium paste is printed onto the back surface in the intended areas for back surface contacting. For this purpose, use is preferably made of special LBSF aluminium pastes, which have a reduced glass frit concentration (for example Solamet® LBSF aluminium pastes from DuPont). The printed wafers are finally heated in the belt furnace and dried.

The process according to the invention for the production of solar cells having a local back surface field using the etching-paste compositions according to the invention accordingly comprises the following process steps, which are reproduced in FIG. 4:

1. Texturing of the surface with pyramidal structures
2. Phosphorus doping (~65 Ω/sq diffusion of $POCl_3$)
3. Etching of the back surface using the etching paste according to the invention, by means of which the surface is polished and at the same time the p/n junction is opened (printing of the etching paste onto the back surface by stencil printing, activation in a belt furnace at about 150° C. for 2 min, rinsing of the wafer with DI water
4. PSG etching using HF (PSG: phosphosilicate glass)
5. Coating of the back surface with $SiO_2$ or $Al_2O_3$ passivation layer and coating of the back surface and front surface with silicon nitride [PECVD-$SiN_x$ (PECVD: plasma enhanced chemical vapour deposition)]
6. Selective opening of the passivation layer and the $SiN_x$ layer by means of etching paste (SolarEtch AQS printing, heating, rinsing)
7. Screen printing for metallisation of the surface (silver paste) and back surface (aluminium paste)/sintering in the belt furnace.

Compared with the known processes for the production of solar cells having a local back surface field (LBSF), the process according to the invention comprises fewer process steps. It is thus possible, by means of the modified process using the etching-paste compositions according to the invention, to save both time and also chemicals which would have been necessary for the two omitted steps. At the same time, the entire production process thus also becomes less expensive.

For the production of solar cells having a local back surface field (LBSF), the process according to the invention and the solar cells produced thereby exhibit the following advantages over the known processes A, B and C described above:

1. Fewer process steps for the production of solar cells comprisng selective emitters
2. Lower costs for carrying out the entire process
3. More environmentally friendly process, since an etching step (polishing step) using an acid mixture consisting of an HF/$HNO_3$ mixture is superfluous and the formation of nitrous gases is thus avoided
4. Higher efficiency, or higher cell efficiencies than standard solar cells Besides these process advantages and the higher efficiency of the solar cells produced, it has been observed that the back surface of the wafer has very low roughness after etching using the novel, alkaline etching paste according to the invention. This low roughness significantly reduces the electron recombination rate. The latter in turn has a positive influence on the efficiency of the solar cell produced.

In particular, these advantages are effected by the use of an alkaline etching paste in process step 3. NaOH, KOH or mixtures thereof may be present therein as alkaline etching component. Preference is given to etching pastes which comprise KOH as alkaline etching component. The corresponding alkaline pastes comprise the alkaline etching component in a concentration in the range from 5 to 40% by weight on, based on the entire composition. The concentration of the etching component is preferably in the range from 10 to 37% by weight. The concentration is particularly preferably in the range from 12 to 35% by weight of KOH or KOH and NaOH in a mixture. Experiments have given particularly good results with compositions which comprise KOH in a concentration of 20 to 35% by weight. Apart from water as solvent, solvents selected from the group glycerol, ethylene glycol, polyethylene glycol, octanol, 1,3-propanediol, 1,4-butanediol, diethylene glycol monomethyl ether, diethylene glycol monoethyl ether, dimethyl sulfoxide and gamma-butyrolactone, in pure form or in a mixture, may be present in the alkaline etching pastes used in accordance with the invention. These solvents can be added to the composition in an amount of 20 to 70% by weight, preferably in an amount of 20 to 60% by weight, particularly preferably in an amount of 20 to 40% by weight. For thickening, the paste comprises non-particulate thickeners selected from the group polyvinylpyrrolidone, polyacrylates, carboxymethylcellulose and hydroxypropylcellulose, in pure form or in a mixture. Furthermore, particulate thickeners selected from the group carbon black, pyrogenic silicic acid, magnesium aluminium silicate and low-melting wax particles can be added to the paste. These particulate thickeners can be added in pure form or in a mixture. Depending on the choice of thickener, thickeners may be present in an etching paste of this type in an amount of in total 0.1 to 35% by weight. Preferably, the thickener concentration in a corresponding etching paste having good etching properties is preferably between 0.5 and 35% by weight.

Figure 6:
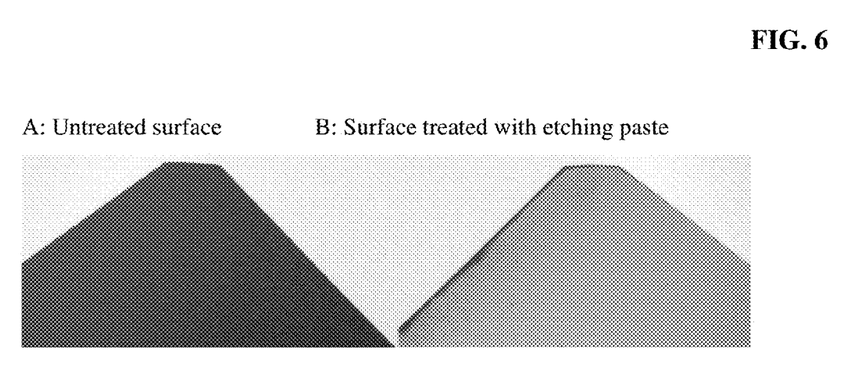
FIG. 6: Comparison pictures of untreated surface and treated surface, effect of the etching pastes according to the invention on silicon surfaces

FIG. 6 shows a photo of the surface of an untreated wafer compared with a wafer after treatment with the etching paste according to the invention. After the etching step using the alkaline etching paste, the smooth reflective surface is clearly evident.

Figure 7:
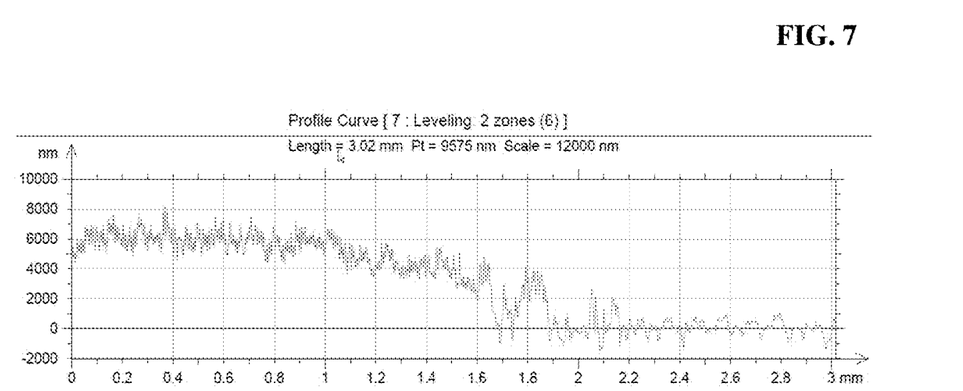
FIG. 7: Surface profile of the etched back surface of the wafer, profile measurement of the surface roughness from right to left (from untreated side to etched side)
Figure 8:
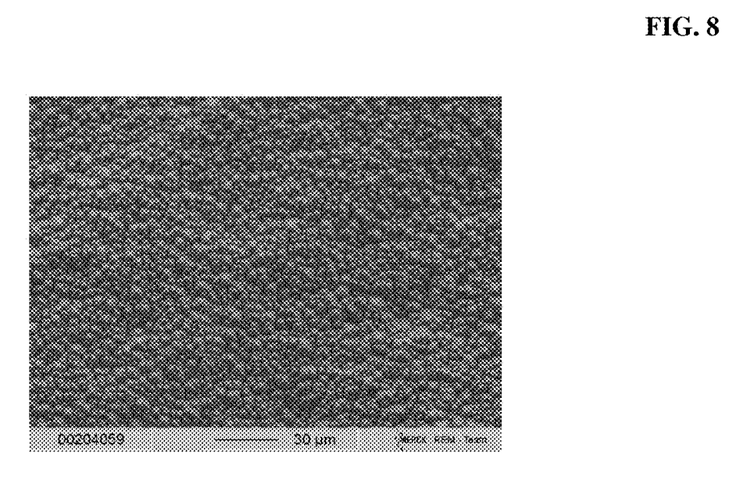
FIG. 8: SEM photomicrographs of the surface of the untreated wafer before the process according to the invention
Figure 9:
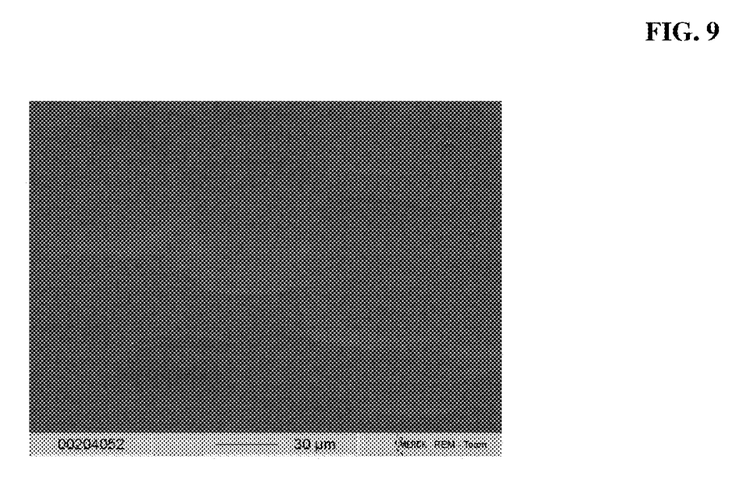
FIG. 9: SEM photomicrographs of the surface of the wafer after the process according to the invention using the etching paste according to the invention

FIG. 7 shows the surface profile of a partially etched wafer. For demonstration, half of the surface of the wafer has not been printed and etched using the etching paste according to the invention. It is thus possible to measure the untreated and etched sides in one measurement operation.

As already stated above, the selective opening of the passivation layer and the $SiN_x$ layer can be carried out using etching pastes as commercially available, for example, under the name SolarEtch AQS. These etching pastes, which are described in greater detail, inter alia, in WO 03/034504 A1, are HF/fluoride-free etching media which are suitable for the etching of inorganic layers and also for the. They usually comprise, as etching component, phosphoric acid and/or salts thereof, which are decomposed to the corresponding phosphoric acid on heating. Owing to their pasty form, the etching pastes can be applied selectively to the surface regions to be opened, so that local openings of the wafer surface can be produced on subsequent heating at temperatures in the range from 250 to 350° C. for 30 to 120 seconds. For the application according to the invention, suitable compositions are those which comprise, as etching component, ortho-phosphoric acid, meta-phosphoric acid, pyrophosphoric acid, or salts thereof and here in particular the ammonium salts (($NH_4$)$_2HPO_4$, $NH_4H_2PO_4$, ($NH_4$)$_3PO_4$) and other compounds which form one of these compounds on thermal decomposition thereof, in adequate concentration, so that they are capable, at temperatures above 250° C., of completely etching away silicon nitride layers of layer thickness 70 nm within a few seconds to minutes. Besides the etching component, these etching pastes comprise solvents, thickeners and optionally additives, such as antifoams, thixotropic agents, flow-control agents, deaerators, adhesion promoters. The etching component is present in the composition in the concentration range 1-80% by weight, based on the total weight of the etching paste, preferably in the moderate to upper concentration range. The proportion of the solvent in the composition can be in the range 20-80% by weight, preferably in the lower to moderate range, based on the total weight of the etching paste. Suitable solvents can be pure inorganic or organic solvents or mixtures thereof, such as water, simple and/or polyhydric alcohols, ethers, in particular ethylene glycol monobutyl ether, triethylene glycol monomethyl ether, or [2,2-butoxy(ethoxy)]ethyl acetate. Furthermore, the proportion of the thickener present in the paste, which is necessary for specific setting of the viscosity range and in principle for achieving printability of the composition, i.e. for the formation of a printable paste, is in the range 1-20% by weight, based on the total weight of the etching paste. Thickeners which may be present are organic or inorganic products or mixtures thereof, such as, for example, cellulose/cellulose derivatives, such as ethyl-, hydroxypropyl-, hydroxyethyl-, sodium carboxymethylcellulose, or starch/starch derivatives, such as sodium carboxymethylstarch (Vivastar®), or anionic heteropolysaccharides), acrylates (such as Borchigel®), polymers, such as polyvinyl alcohols (Mowiol®), polyvinylpyrrolidone (PVP), or highly disperse silicic acids, such as Aerosil®. Both types of thickeners, organic and inorganic, can also be combined as desired. Additives optionally present can be antifoams, thixotropic agents, flow-control agents/antiflow agents, deaerators and adhesion promoters.

For selective metallisation of the surface using a silver paste, corresponding screen-printable compositions can be used, as marketed, for example, by Dupont under the trade name PV 145 Conductor® or by Metalor® under the trade name MetPaste HeliSil5718®. Pastes of this type can contain silver in an amount of 50 to 80% by weight, based on the total weight, and solvents or solvent mixtures, further organic additives and water, as well as inorganic oxides, such as zinc oxide, silicon dioxide, thallium oxide, lead in glass frit. Inter alia, substances such as 2,2,4-trimethyl-1,3-pentanediol monoisobutyrate, dibutyl phthalate, terpineol, 2-(2-butoxyethoxyl)ethyl acetate or ethylcellulose may be present, in each case in matched amounts, giving screen-printable pastes. The compositions should be selected here in such a way that the heating after the metallisation pastes have been printed on results in the formation of conductive metal layers which no longer contain any interfering organic substances by means of which the conductivity would be impaired.

As already stated above, the metallisation of the back surfaces is carried out using aluminium pastes which are likewise screen-printable and can be sintered by heating at elevated temperatures to give corresponding conductive coatings. Suitable pastes are marketed by PEMCO EUROINKS S.r.l under the name AG/AL 8205 PC silver aluminium pastes. Corresponding aluminium pastes comprise at least 1 to 10% by weight of aluminium besides silver in an amount of 50 to 85% by weight and may comprise corresponding solvents and additives, like the silver pastes described above, where the specifically mentioned aluminium paste comprises enamel frit based on borosilicate glass in an amount of 1-% by weight, lead compounds in an amount of 1-5% by weight and alpha-terpineol in an amount of less than 20% by weight. Like the silver pastes described above, screen-printable aluminium pastes are also employed here in the process according to the invention. Correspondingly, the aluminium pastes must on the one hand be capable of being printed well and on the other hand must adhere well to the surfaces, so that they can be printed selectively and bond well to the layers of the wafer at high temperatures and form a uniform conductive metallisation layer.

For the production of monocrystalline or multicrystalline solar cells, corresponding wafers are basically typically cut out of solid drawn silicon rods or cast silicon blocks using a wire saw (Dietl J., Helmreich D., Sirtl E., Crystals: Growth, Properties and Applications, Vol. 5 Springer Verlag 1981, pp. 57 and 73). An exception is formed by the silicon drawn by the EFG method (edge-defined film-fed growth) (Wald, F. V.; Crystals: Growth, Properties and Applications, Vol. 5 Springer Verlag 1981, p 157).

For the production of solar cells having a local back surface field (LBSF) by the process according to the invention, it is possible to employ monocrystalline or polycrystalline silicon wafers produced correspondingly, which may in turn be doped with boron [p-type silicon, 5" size (125×125 mm, D 150 mm), thickness 200-260 µm, resistivity 1.0-1.5 Ω·cm].

The wafers are usually sawn out of mono- or polycrystalline silicon rods. The sawn monocrystalline or multicrystalline silicon wafers obtained in this way have a rough surface. This roughness is also referred to as saw damage, where the peak-to-valley height is about 20-30 µm. These differences in the surface plane are disadvantageous for the further production of high-performance solar cells. A so-called saw damage etch is therefore carried out before further processing of the wafers into solar cells, but in particular for achieving the highest possible efficiency. Besides the actually intended removal of the saw damage (very badly damaged surface regions of the wafer having a depth of several µm), contamination located in the troughs of the surface is removed during this saw damage etch. This contamination is, in particular, metal abrasion from the saw wire, but also traces of abrasive. The saw damage etch is typically carried out in an approximately 30% potassium or sodium hydroxide solution at temperatures of about 70° C., preferably higher, in particular at 90° C. Due to the etching rates of about 2 µm/min, which are also relatively low under these conditions, etching times of 10 min and possibly longer may be necessary in order to achieve the desired effect. An Si layer with a thickness of about 7 µm is usually removed on both sides of the wafer in this way.

Although this etching produces a rough surface on the substrate, the opening angles achieved at the surface here are, however, very flat and totally unsuitable for reducing reflections or even multiple reflections at the surface. Such reflection effects are, however, desired in order to achieve high efficiencies of the cells. A multiplicity of publications and patents therefore relate to the reduction of reflections at solar cells of all types, for example also for amorphous solar cells (U.S. Pat. No. 4,252,865 A).

In the further description, examples of the process according to the invention for the production of solar cells having an LBSF and the etching pastes used therein which are within the scope of protection of the present invention are given for better understanding and in order to illustrate the invention. These examples also serve to illustrate possible process variants or possible variations of suitable paste compositions for the etching step. Owing to the general validity of the inventive principle described, however, the examples are not suitable for reducing the scope of protection of the present application to these alone.

The temperatures given in the examples and description and in the Claims are always in ° C. Unless stated otherwise, content data are given as % by weight or weight ratios.

Furthermore, it goes without saying to the person skilled in the art that, both in the examples given and also in the remainder of the description, the component amounts present in the compositions always add up only to 100% by weight, mol-% or % by volume, based on the total composition, and cannot exceed this, even if higher values could arise from the percent ranges indicated. Unless indicated otherwise, % data are regarded as % by weight, with the exception of ratios, which are shown in volume data.

Production of Solar Cells According to the Invention:

A reduction in the reflection of solar cells is usually achieved by texturing using an alkaline solution, preferably comprising a KOH solution and isopropanol, or using an acidic solution consisting of an acid mixture of HF and $HNO_3$.

After texturing, a surface cleaning is carried out with acid-containing, aqueous solutions, with hot demineralised water or also treatment in an oven in the following sequence:
HF, HCl, HF, hot demineralised water, HF, treatment in the oven.

After the surface of the wafer has been cleaned, the single-step emitter is formed in a diffusion step. This is a batch process, in which the surface of the wafer is doped with phosphorus within about one hour, preferably within about 40 minutes, at a temperature of higher than 800° C., a maximum of 895° C. The doping is carried out using liquid $POCl_3$. After about 40 minutes, the desired conductivity of about 65 ohm/sq has been reached.

Figure 10:
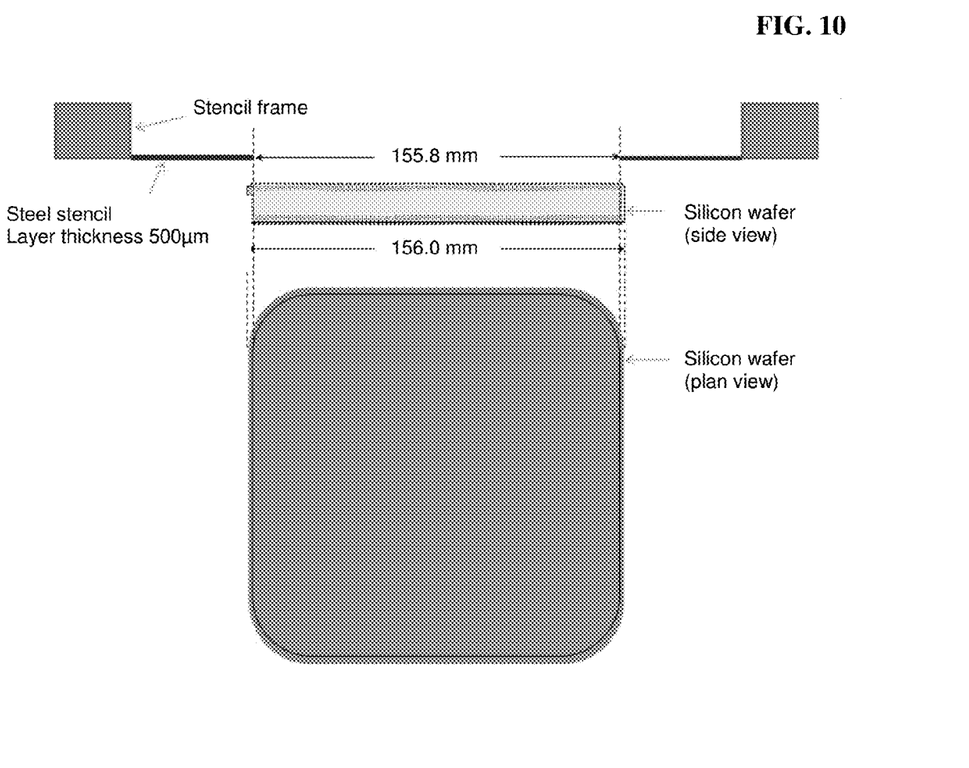
FIG. 10: Detail sketch for the stencil printing of the etching paste onto the back surface of the wafer (with dimensions)
Figure 11:
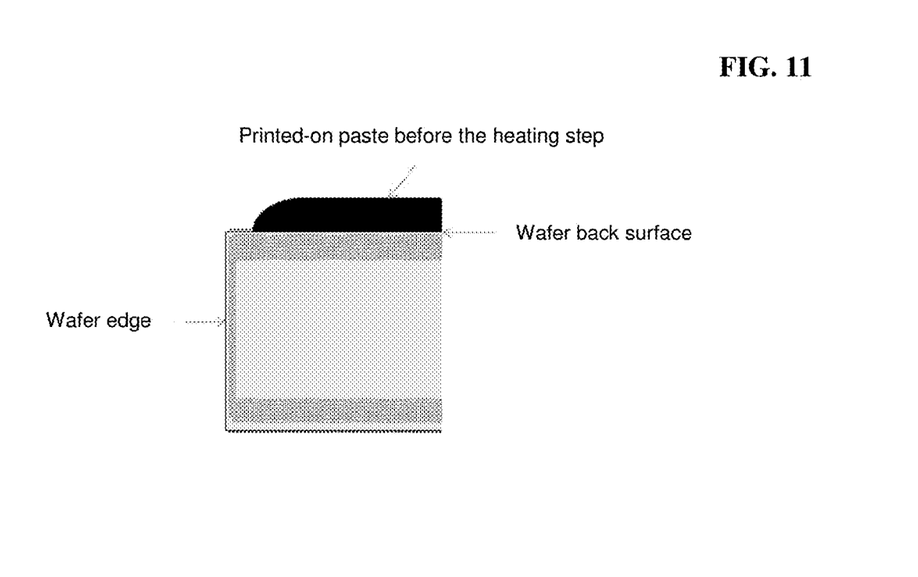
FIG. 11: Detail sketch (side view of edge region) of the printed-on paste before the heating step. Paste separation from the edge after printing about 100 µm.
Figure 12:
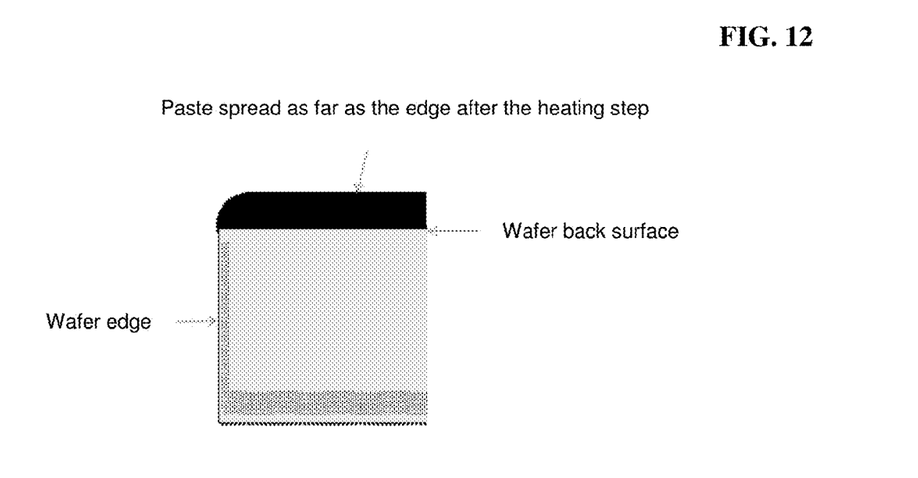
FIG. 12: Detail sketch (side view of edge region) of the printed-on paste after the heating step. Paste has flowed to the edge.

Using an alkaline etching paste, the back surface polishing and the back surface edge insulation is carried out in one process step. The etching paste is applied by stencil printing here. For the etching step, a KOH-containing etching paste is used. The paste can be applied using a screen-printing machine, (for example suitable machine from Baccini, print monitoring using four cameras). The etching pastes can be printed using, for example, a stencil from Koenen with a stencil thickness of 500 µm. The paste can be printed very well using a steel doctor blade. The following parameters were set for the paste printing: no separation; printing speed: 150 mm/s. The etching paste is applied over the entire surface with a separation of 200 μm from the edge of the wafer (see sketch from FIG. 10). For the etching, the printed wafer is heated at a temperature up to 150° C. for a period of about 5 minutes, causing the etching paste to be activated. A belt furnace is used for this purpose. The furnace is divided into four heating zones. Zone 1 is set to 250° C., zone 2 to 200° C., zone 3 to 150° C. and zone 4 to 150° C. The belt speed is 51 cm/min. The etched wafer is then cleaned using a Rena inline cleaning unit. The cleaning is carried out in two steps. In the first step, the wafer is treated in a continuous ultrasound bath (2×500 W, 40 kHz). In the second step, the wafer is cleaned on both sides using a water jet and subsequently dried (compressed air).

PSG glass etching and wet-chemical surface cleaning is carried out using HF, hot demineralised water and again using HF. A thin layer with a thickness of 20 nm of thermal $SiO_2$ is deposited on the back surface. 90 nm of LPCVD $SiN_x$ is then deposited on the front surface and on the back surface.

The LPCVD $SiN_x$ deposition on both surfaces is carried out at up to 790° C. The process duration for the deposition of a layer thickness of 90 nm is about 2 hours. The reaction gases used for the deposition of $Si_3N_4$ are dichlorosilane and $NH_3$.

A dot layout with about 90,000 dots (diameter of about 100 μm and separation of 500 μm) is subsequently printed onto the back surface of the wafer. The paste can be applied using a screen-printing machine. The etching pastes can be printed, for example, using a screen from Koenen with the specification 280 mesh/inch and a wire diameter of 25 μm. The clamping angle of the screen is preferably 22.4°. The screen emulsion used is the Azokol Z130 type from Kissel & Wolf. The paste can be printed very well using a diamond doctor blade and a doctor blade hardness of 80 shore.

The following parameters are set here for the printing of the paste:
separation: 1.2 mm;
pressure: 70 N;
speed: 150 mm/s.

For the etching, the printed wafer is heated at a temperature of up to 400° C. for a period of about 5 minutes, causing the etching paste to be activated. A belt furnace is used for this purpose. The furnace is divided into four heating zones. Zone 1 is set to 550° C., zone 2 to 400° C., zone 3 to 400° C. and zone 4 to 300° C. The belt speed is 51 cm/min. The etched wafer is then cleaned using an inline cleaning unit (for example from Rena). The cleaning is carried out in two steps. In the first step, the wafer is treated in a continuous ultrasound bath (2×500 W, 40 kHz), and in the second step is cleaned on both sides using a water jet and subsequently dried, for example using compressed air.

The requisite back surface contacts can be produced under the following conditions:

The paste can be applied using a screen-printing machine It is advantageous here to monitor the print result continuously. In the unit employed for the experiments, the monitoring is carried out using four cameras. Ag/Al paste is used as standard. For the process described, a corresponding paste from DuPont, PV 502, was used in the experiments. The paste can be printed using, for example, a screen from Koenen with the specification 230 mesh/inch and a wire diameter of 36 μm. The clamping angle of the screen is preferably 45°. The screen emulsion used can be the ISAR type from Koenen. It has been found here that the paste used can be printed very well using a diamond doctor blade and a doctor blade hardness of 60 shore.

The following parameter settings have proven advantageous for the printing of the pastes:
separation: 1.2 mm;
pressure: 70 N;
speed: 150 mm/s.

Using the Ag/Al paste, two busbars measuring 5 mm×124 mm are printed onto the back surface. The printed paste thickness is about 15 μm. For drying, the printed wafer is warmed at up to 200° C. for a period of about 3 minutes. A belt furnace can be used for this purpose.

Aluminium LBSF Contact:

The paste is applied using a screen-printing machine which is sold under the name "Baccini printer" (with four cameras). The process described is carried out using the Solamet® PV36x aluminium paste (conductive pastes for local back surface field solar cells from DuPont). The paste is printed using a screen from Koenen with the specification 330 mesh/inch and a wire diameter of 34 μm. The clamping angle of the screen for this purpose is preferably 45°. The screen emulsion used is an emulsion of the ISAR type from Koenen. The paste employed can be printed very well using a diamond doctor blade and a doctor blade hardness of 60 shore. In this case, the following parameter setting have proven advantageous: separation: 1.2 mm; pressure: 70 N; speed: 150 mm/s. The entire back surface is printed using the standard Al paste. The printed thickness of the pastes is preferably about 22 μm, where the amount of paste applied is about 2.64 mg/cm². For drying, the printed wafer is warmed at up to 290° C. for a period of about 3 minutes. This is carried out in a belt furnace.

Front Surface Contact (Lines):

The paste is applied using a screen-printing machine which is sold under the name "Baccini printer" (with four cameras). For the process described, the PV 145 silver paste from the DuPont company is used by way of example. The paste is printed using a screen from Koenen with the specification 280 mesh/inch and a wire diameter of 25 μm. The clamping angle of the screen is 22.5°. The screen emulsion used in this case is the ISAR type from Koenen. The paste can be printed very well using a diamond doctor blade and a doctor blade hardness of 60 shore. The following parameter settings have proven suitable for the printing of the pastes under the conditions tested:
separation: 1.2 mm;
pressure: 70 N;
speed: 160 mm/s.

Using the silver paste, the front surface layout with 2 busbars and fingers is printed. The line width is 80 μm and the separation between the fingers is 1.7 mm. The width of the main busbar is 2 mm. The paste thickness printed is about 20 μm. For drying, the printed wafer is warmed at a temperature of up to 290° C. for a period of about 3 minutes. A belt furnace can be used for this purpose.

Firing Conditions:

The silicon wafers printed using metal paste are transported through an IR belt furnace, where they are heated to a maximum temperature of 880° C. and fired. This temperature step serves both for burning out the organic paste components and also for sintering and melting the metal particles and the glass frit components. This produces a surface contact which is stable in the long term (state of the art: "co-firing" and "ARC firing through"). The firing in the process described can be carried out using a belt furnace with 7 zones, where the following temperature profile has proven advantageous: 250-350-400-480-560-560-880° C. at a belt speed of 1.5 m/min.

Properties of the LBSF Cell:

The solar cells produced are characterised by means of a sunlight simulator (Xe lamp) under standard conditions (STC. 1000 W/sqm, AM 1.5, temperature: 25° C.). The following measurement values have been found for the cell produced as a model:

| Wafer | Isc (mA/cm$^2$) | Uoc (mV) | FF (%) | EFF (%) |
|---|---|---|---|---|
| LBSF cell | 38.1 | 627 | 75.5 | 18.00 |
| Reference | 37.7 | 625 | 74.6 | 17.6 |

The measurements show that the process according to the invention can be used to produce solar cells comprising single-step selective emitters with an efficiency increased by >0.4% compared with the efficiencies of standard solar cells.

Examples of Etching Pastes Used

Example 1

116 g of KOH
0.5 g of polyvinylpyrrolidone
is added to a solvent mixture consisting of
240 g of glycerol
64 g of water
with vigorous stirring. 22 g of carbon black are then added to the clear homogeneous mixture, which is then stirred for a further 2 hours.

Example 2

88 g of KOH
and
0.3 g of carboxymethylcellulose
are added to a solvent mixture consisting of
210 g of polyethylene glycol
54 g of water
with vigorous stirring. 5 g of Ceridust (polyethylene wax) are then added to the clear homogeneous mixture, which is then stirred for a further 2 hours.

Example 3

98 g of KOH
and
0.3 g of carboxymethylcellulose
are added to a solvent mixture consisting of
210 g of 1,4-butanediol
54 g of water
with vigorous stirring. 5 g of Ceridust 9202 F are then added to the clear homogeneous mixture, which is then stirred for a further 2 hours.

Example 4

Alternative Etching Paste Comprising KOH 15 g of carboxymethylcellulose
are added to a solvent mixture consisting of
250 g of KOH solution (60%)
520 g of gamma-butyrolactone
with vigorous stirring.
70 g of Ceridust 9202 F are then added to the clear homogeneous mixture, which is then stirred for a further 2 hours Example 5

70 g of KOH,
50 g of NaOH
and
0.5 g of polyvinylpyrrolidone
are added to a solvent mixture consisting of
240 g of glycerol
64 g of water
with vigorous stirring. 22 g of carbon black are then added to the clear homogeneous mixture, which is then stirred for a further 2 hours.

The paste, which is now ready to use, can be printed using a steel stencil (see FIG. 10) or a printing screen with stainless-steel fabric (70 mesh/inch and emulsion thickness of 50 um). In principle, other screen fabric materials can also be used. In storage experiments, the etching paste prepared has proven to have a long shelf life with retention of the advantageous etching properties.

The invention claimed is:

1. A process for producing a solar cell having a local back surface field, comprising etching in one etching step a phosphosilicate glass layer and an underlying silicon layer by a printed-on etching paste, and back surface polishing and back surface edge insulating in one step by an alkaline etching paste.

2. A process according to claim 1, wherein the alkaline etching paste for the back surface polishing and the back surface edge insulating comprises, as etching component, NaOH, KOH or a mixture thereof, and which etches a phosphosilicate glass layer and an underlying silicon layer in one step.

3. A process according to claim wherein contact windows are etched into a back surface multilayer (passivation layer and SiNx) of the wafer by an acidic etching paste which has particular selectivity for silicon layers.

4. A process according to claim 1, comprising
I. Texturing of the surface
II. Phosphorus doping (~65 Ω/sq diffusion of POCl$_3$)
III. Etching of the back surface by an alkaline etching paste, by which the surface is polished and at the same time the p/n junction is opened, where the etching paste is printed onto the back surface by stencil printing, the paste is activated in a belt furnace at about 150° C. for 5 min, and the wafer is subsequently rinsed with DI water,
IV. Coating of the back surface with an SiO2 or Al2O3 passivation layer having a thickness of 15-30 nm and subsequent coating of the back surface and front surface with silicon nitride (70-100 nm) by plasma enhanced chemical vapour deposition (PECVD-SiN$_x$)
V. Printing-on of the etching paste by screen printing, heating in the belt furnace and rinsing with DI water
VI. Screen printing for metallisation of the front surface and the back surface with subsequent sintering (co-firing).

5. A process according to claim 1, wherein the alkaline etching paste comprises KOH.

6. A process according to claim 1, wherein opening the back surface passivation layer is by a phosphoric acid-containing etching paste.

7. A process according to claim 1, wherein the an alkaline etching paste comprises NaOH, KOH or a mixture thereof in an amount of 5 to 40% by weight.

8. A process according to claim 7, wherein the alkaline etching paste is a KOH-containing etching paste, and comprises, as solvent, glycerol, ethylene glycol, polyethylene glycol, octanol, 1,3-propanediol, 1,4-butanediol, diethylene glycol monomethyl ether, diethylene glycol monoethyl ether, dimethyl sulfoxide or gamma-butyrolactone, in pure form or in a mixture.

9. A process according to claim 7, wherein the alkaline etching paste is a KOH-containing etching paste, and comprises at least one non-particulate thickener.

10. A process according to claim 7, wherein the alkaline etching paste is a KOH-containing etching paste, and comprises a non-particulate thickener selected from the group consisting of polyvinylpyrrolidone, polyacrylates, carboxymethylcellulose and hydroxypropylcellulose in pure form or in a mixture.

11. A process according to claim 7, wherein the alkaline etching paste is a KOH-containing etching paste, and comprises a particulate thickener selected from the group consisting of carbon black, pyrogenic silicic acid, magnesium aluminium silicates and low-melting wax particles in pure form or in a mixture.

12. A process according to claim 7, wherein the alkaline etching paste is a KOH-containing etching paste, and comprises a thickener in an amount of 0.1-35% by weight.

* * * * *